United States Patent [19]
Frankenthal et al.

[11] Patent Number: 5,288,951
[45] Date of Patent: Feb. 22, 1994

[54] COPPER-BASED METALLIZATIONS FOR HYBRID INTEGRATED CIRCUITS

[75] Inventors: Robert P. Frankenthal, Summit, N.J.; Ajibola O. Ibidunni, Litchfield; Dennis L. Krause, Atkinson, both of N.H.

[73] Assignee: AT&T Bell Laboratories, Murray Hill, N.J.

[21] Appl. No.: 968,810

[22] Filed: Oct. 30, 1992

[51] Int. Cl.$^5$ .............................................. H05K 1/00
[52] U.S. Cl. ................................... 174/257; 427/125; 361/765; 361/808
[58] Field of Search ................ 174/257, 250; 361/418, 361/402; 427/125

[56] References Cited

U.S. PATENT DOCUMENTS 4,016,050 4/1977 Lesh et al. .
4,109,297 8/1978 Lesh .................................... 361/402
5,152,869 10/1992 Ferraris et al. .

OTHER PUBLICATIONS

J. M. Morabito, et al., "Material Characterization of Ti-Cu-Ni-Au (TCNA) . . .", IEEE Trans. on Parts, Hybrids, Packaging, 1975, vol. PHP-11, pp. 253-262.
M. Stern et al., "The Influence of Nobel Metal Alloy Additions on the Electrochemical . . .", Jrnl. Electrochemical Society, vol. 106, No. 9, pp. 759-764.

Primary Examiner—Leo P. Picard
Assistant Examiner—Cheryl R. Figlin
Attorney, Agent, or Firm—Oleg E. Alber

[57] ABSTRACT

A new metanization is described which is a composite of subsequent metal layers beginning with a layer of titanium and having in an ascending order the following composition: Ti - TiPd - Cu - Ni - Au. TiPd is an alloy of titanium and palladium containing from 0.3 to 14 weight percent Pd, by the weight of the alloy. The TiPd alloy is etchable in an aqueous BF solution containing from 0.5 to 2.0 and higher, preferably from 0.5 to 1.2 weight percent BF. The use of the TiPd alloy avoids the occurrence of Pd residues remaining after the etching of Ti layer and liftoff (rejection etching) of Pd layer in a prior art Ti-Pd-Cu-Ni-Au metanization. Ti and TiPd layers are present in a thickness ranging from 100 to 300 nm and from 50 to 300 nm, respectively, and in a total minimum thickness needed to maintain bonding characteristics of the metallization. The metallization is suitable for use in various circuits including integrated circuits (ICs), hybrid integrated circuits (HICs), film integrated circuits (FICs), multi-chip modules (MCMs), etc.

7 Claims, 3 Drawing Sheets

COPPER-BASED METALLIZATIONS FOR HYBRID INTEGRATED CIRCUITS

FIELD OF THE INVENTION

This invention pertains to copper-based metahizations for integrated circuits, such as high-speed, high-density hybrid integrated circuits.

BACKGROUND OF THE INVENTION

In the past Hybrid Integrated Circuits (HICS) suitable for high-voltage and high-performance applications were manufactured with Ti-Pd-Au (TPA) metallizations. However, the high cost of palladium and gold led to the development of lower cost substitutes for the noble metals in the TPA metanization system. The copper-based metahization, Ti-Cu-Ni-Au (TCNA), was developed as a low-cost alternative to the TPA metahization. The TCNA metallization eliminated the use of Pd and reduced the thickness of gold needed for a relatively low sheet resistance. Apart from the lower cost of the copper-based metallization, copper also offers the benefit of higher conductivity. See J. M. Morabito et al., "Material Characterization of Ti-Cu-Ni-Au (TCNA) - A Low-Cost Thin Film Conductor System", *IEEE Transactions on Parts, Hybrids, and Packages,* Vol. PHP-11, No. 4, December 1975, pp. 253–262. While Morabito taught complete elimination of the Pd layer, U.S. Pat. No. 4,016,050 suggests inclusion of Pd in the TCNA metallizations as an optional thin film between the Ti and Cu layers, and U.S. Pat. No. 4,109,297 teaches the use of a Pd thin film to improve adhesion between Ti and Cu layers forming Ti-Pd-Cu-Ni-Au (TPCNA) metahization in an attempt to overcome corrosion problems which were encountered in TCNA metahizations during the HIC fabrication. The corrosion manifested itself as a broad delamination of the copper layer from the titanium layer and as a combination of delamination and blistering between the copper and titanium layers. The delamination was observed after plating Cu-Ni-Au on the sputtered Ti-Cu film. In the combined form of corrosion (delamination and blistering), the delamination was accompanied by blistering of the TCNA film after a 30 minute heat treatment at 200° C. In both types of corrosion, the addition of the sputtered Pd layer between the Ti and Cu layers eliminated the problem.

The use of Pd in the TPCNA metahization, however, led to yet another problem. Incomplete etching of the TPCNA metahization, as evidenced by metallic residues on the substrate, was frequently observed during the fabrication of the HICS. These residues occur mostly because the Pd layer is not etched chemically but rather is undercut and lifts off or flakes off (rejection etching) when the underlying Ti is chemically etched in a dilute HF solution.

SUMMARY OF THE INVENTION

This invention embodies a new metallization which is a composite of subsequent metal layers having in an ascending order the following composition: Ti - TiPd - Cu - Ni - Au. TiPd is an alloy of titanium and palladium containing from 0.3 to 14 weight percent Pd, by the weight of the alloy. The TiPd alloy is HF etchable in a 0.5 to 2.0 and higher weight percent aqueous BF solution. The use of the TiPd alloy avoids the occurrence of Pd residues remaining after the etching of Ti layer and lift-off (rejection etching) of Pd layer in a prior art Ti-Pd-Cu-Ni-Au metallization. Ti and TiPd layers are each present in a thickness ranging from 100 to 300 nm and from 50 to 300 nm, respectively, and in a total minimum thickness needed to maintain bonding characteristics of the metallization. The new metallization is usable in various circuits, including integrated circuits (ICs), hybrid integrated circuits (HICs), fihn integrated circuits (FICs), multi-chip modules (MCMs), etc.

DETAILED DESCRIPTION

This invention embodies a new metallization which is identified as Ti-TiPd-Cu-Ni-Au [T(TP)CNA]. Here, TiPd and (TP) denote titanium-palladium alloys. This metallization is tonned by replacing the Pd film in a prior art Ti-Pd-Cu-Ni-Au metallization with a film of TiPd alloy. Pd is included in the alloy in an amount ranging from 0.3 to 14.0 weight percent, preferably from 0.5 to 10 weight percent, more preferably from 2 to 7 weight percent, based on the weight of the alloy. The lowest limit of the broader range is a minimum amount sufficient to afford corrosion protection to the Ti, and the uppermost limit is a maximum amount beyond which no substantial increase in the corrosion protection takes place while the possibility of Pd rejection etching is increased. The corrosion resistance of circuits fabricated with the T(TP)CNA metallization is equivalent to circuits with the standard TPCNA metallization. The beneficial effects of Pd, when present in the metallization as an alloy of Ti and Pd, are equivalent to those provided by a separate layer of Pd. The beneficial effects include reduction of the tendency for delamination and blistering between copper and titanium.

Within the above range, TiPd alloy is etchable in a dilute aqueous BF solution. The etchability of the alloy diminishes with an increase in the amount of Pd in the alloy beyond 10 weight percent. Replacement of the sputtered Pd film in the TPCNA metallization with a sputtered TiPd alloy film eliminates the incomplete etch metal residues. The sputtered alloy film can be easily etched at a lesser BF concentration than that needed for rejection etching. Successful etching of circuits using the alloy was obtained at concentrations ranging from 0.5 weight percent HF to 2.0 weight percent BF and higher. Incomplete etching (residues present) may occur at BF concentrations lower than 0.5 weight percent.

Figure 1:
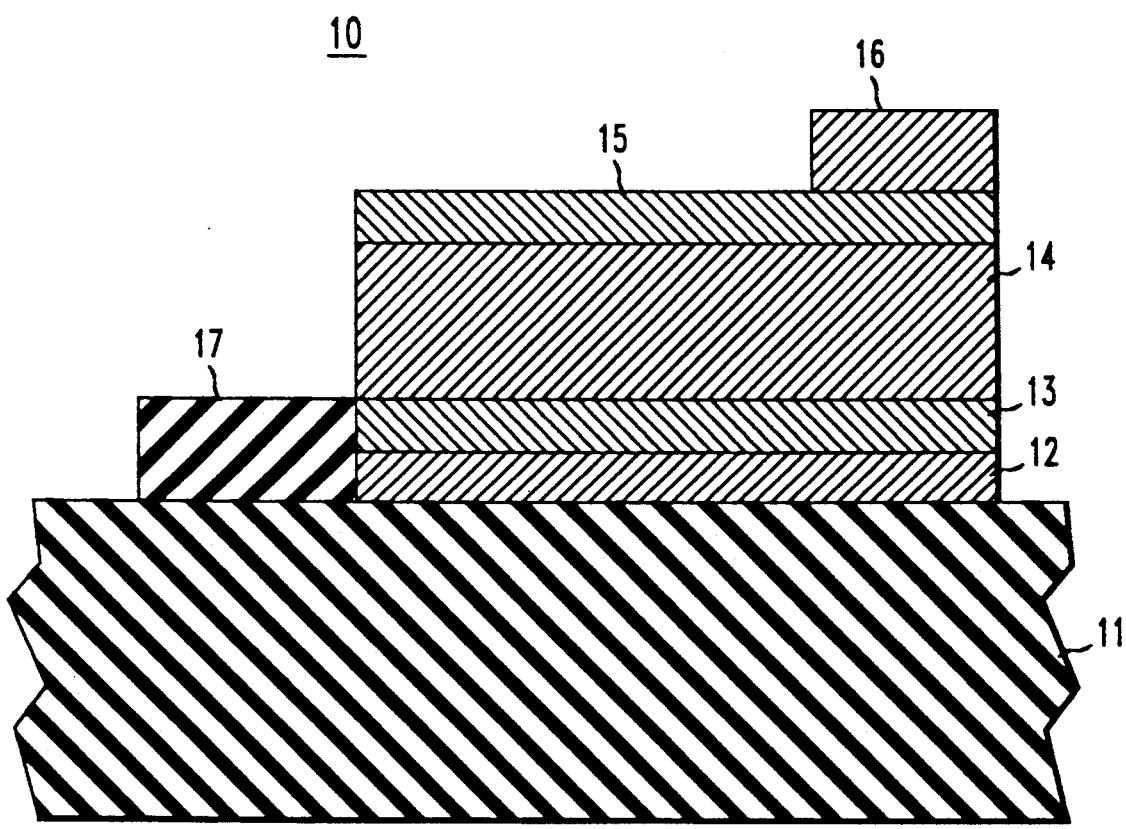
FIG. 1 is a schematic representation of a metallization on a nonconductive substrate.

In FIG. 1. is shown schematically a contact metallization, generally denoted by numeral 10, upon a nonconducting substrate, I 1. Metallization 10 is a composite of layers which include, in an ascending order from the substrate, titanium, 12, titanium-palladium alloy, 13, copper, 14, nickel, 15, and gold, 6. The layers are deposited in thicknesses such that Ti is in a range of from 100 to 300 nanometers (nm), with approximately 200–250 nm being optimum; TiPd alloy is in a range of from 50 to 300 nm, with 100–150 nm being optimum; Cu is in a range of from 2,500 to 4,000 nm, with 3,000 nm being optimum; Ni is in a range of from 800 to 2,000 nm, with 1,000 nm being optimum; and Au is in a range of from 700 to 2500 nm, with 1,500 nm being optimum. The reasons for the thicknesses of Ti, Cu, Ni and Au layers are stated at length in the U.S. Pat. No. 4,016,050, and need not be restated herein. The combined minimum thickness of Ti and TiPd layer is such as to maintain bonding characteristics of the metallization.

Figure 2:
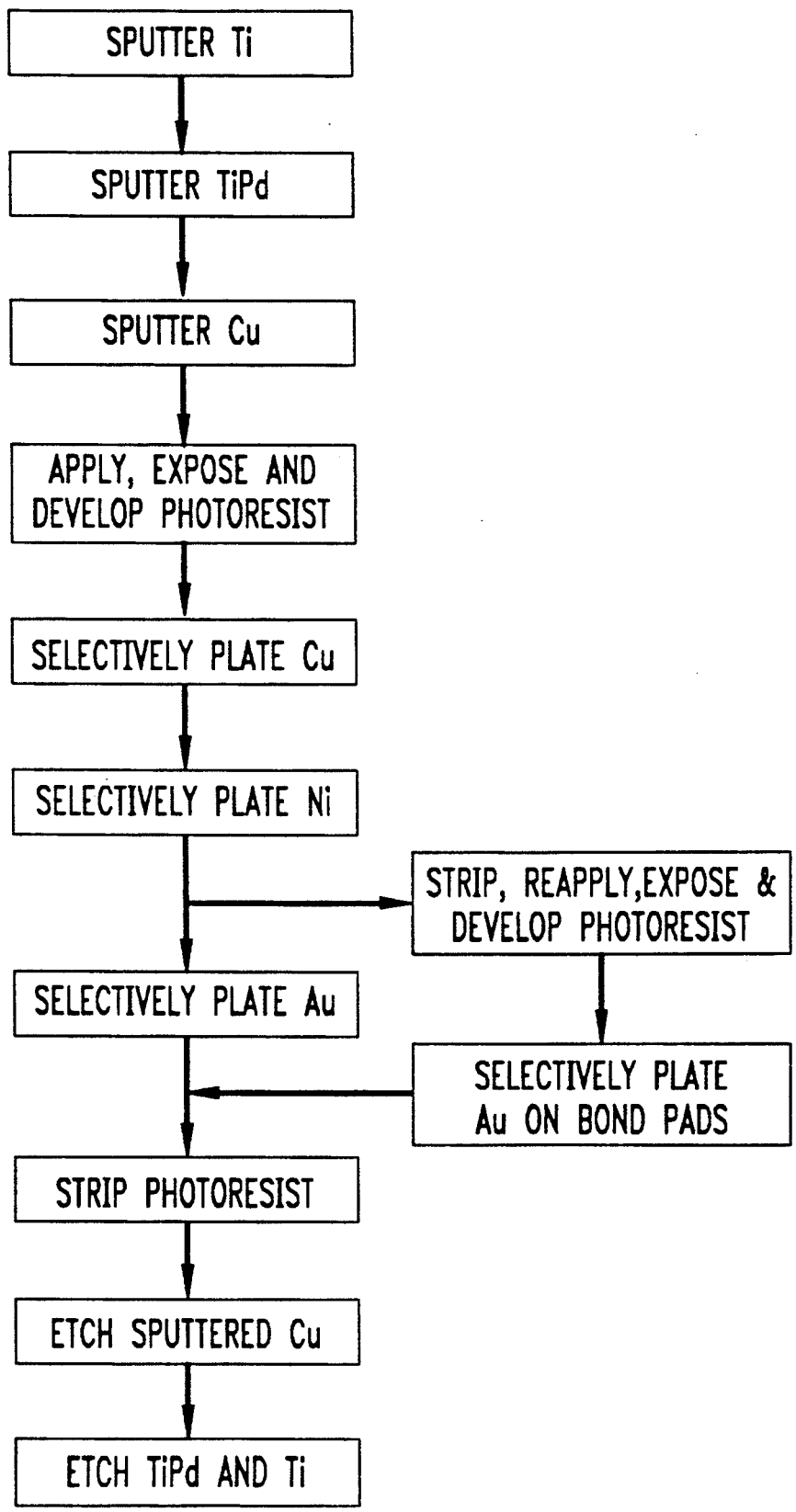
FIG. 2 is a flow diagram illustrating the fabrication steps in accordance with two alterative embodiments of the invention.

In FIG. 2 is shown a flow diagram for preparing the metallization according to this invention. The flow diagram, in general, follows that disclosed in U.S. Pat. No. 4,016,050 for deposition of TiPdCuNiAu metallizations. The procedure differs by substituting TiPd alloy for Pd, and etching both the Ti and TiPd layers in a single dilute aqueous HF solution.

The sequence of steps illustrated in FIG. 2 begins with deposition of a layer of Ti preferably over substantially an entire area of an insulating substrate selected from ceramic and polymer substrates, such as alumina, polyimide, triazenebased polymers, etc., followed by the deposition of TiPd alloy layer on the Ti layer and by deposition of a thin film of Cu on the TiPd layer. The thin Cu film is deposited in a thickness within a range of from 300 to 700, preferably 500 nm, which is a fraction of the total Cu thickness of from 2,500 to 4,000 nm. The Ti, TiPd and thin Cu film are deposited by sputtering. These sputtering steps typically follow the deposition on the substrate of elements of a circuit such as resistor and capacitor elements, e.g., 17 (FIG. 1). Sputtering of Ti, TiPd and Cu films permits deposition of these metals in the same chamber without breaking the vacuum. TiPd alloys were sputtered using a target that consisted of Pd slugs inserted into a Ti target. The ratio of Pd surface area to Ti surface area in the target determines the sputtered film composition as is well known in the art. Alternatively, a TiPd alloy target may be used to deposit the TiPd alloy layer. While sputtering is the preferred kind of deposition, these layers may be deposited by electron gun (or beam) evaporation.

The sputtering of the Ti, TiPd layers and of the thin Cu film is followed by deposition of photoresist to the surface of the thin Cu film, and patterning of the photoresist exposing Cu surface into a pattern defining desired interconnection paths. Cu is then electroplated on top of the exposed surface of the thin Cu film in an additional thickness resulting in a total desired thickness of Cu layer 14. This is followed by electroplating of Ni.layer 15 on Cu layer 14. At this time Au may be electroplated on top of Ni layer 15 in the same pattern as the Ni layer. Alternatively, the prior photoresist pattern may be replaced with a new pattern delineating only those areas where Au is required for contact purposes, such as Au layer 16.

Thereafter, the photoresist is stripped from the whole of the metallization areas and those portions of the thin Cu film, TiPd layer and Ti layers which are not protected by the metallization pattern are etched away. Cu film is removed by an aqueous ammoniacal solution. Care should be taken to avoid etching of the Ni layer and under-etching of the plated copper layer. TiPd and Ti both are etched by dilute hydrofluoric acid solution containing from 0.5 to 2, and higher, weight percent of HF. BF concentration limits ranging from 0.5 weight percent to 1.2 weight percent for the Ti-TiPd etch are especially suitable. Both of these etching solutions are well known in the art.

The use of TiPd alloy instead of Pd permits etching of both Ti and TiPd layers by the same hydrofluoric acid etching solution. Circuits fabricated from metallizations that contained the TiPd alloy (0.3–14 weight percent Pd) on a Ti layer were etched successfully in 1.2 weight per-cent BF with no visible residue. In contrast, removal of Pd from the combination of Ti and Pd layers by etching of Ti and lift-off or flaking-off of Pd (rejection etching) in a 1.2 weight percent HF solution leads to metallic Pd residues on the substrate. At a concentration of 0.65 weight percent BF all circuits containing TiPd alloy were etched successfully, as confirmed by continuity and isolation tests. For concentrations less than 0.5 weight percent HF, residues were observed on ceramic and polymer substrates. It should be noted that the T-P (Ti-Pd) portion of the TPCNA metallization cannot be reliably etched at HF concentrations below 1.0 weight percent.

To evaluate and compare the corrosion susceptibility and corrosion resistance of T(TP)CNA thin-film metallizations with the TPCNA thin film metallizations, a number of thin-film metallizations and test circuits were prepared on ceramic, e.g., alumina, and polymer, e.g., polyimide, triazene-based polymers, etc., substrates. The thin-film metallizations and test circuits were prepared by sputtering titanium-(titanium palladium alloy)-copper [T(TP)C], and titanium-palladium-copper (TPC), and then electroplating the sputtered deposit with successive layers of copper, nickel, and gold. T(TP)CNA samples were prepared with TiPd alloys containing 3 weight percent Pd and 5 weight percent Pd.

These metallizations were subjected to the following environments: boiling aqueous solution of 10 weight percent HCI, the vapor phase over either boiling 1M HCI or boiling 1M HCI and NAOCI (Chlorox ®). In each of these tests the T(TP)CNA metallizations showed corrosion resistance comparable to those of the TPCNA metallizations. Circuits fabricated with TPCNA and T(TP)CNA (3 and 5 weight percent Pd) metallizations were also placed in a furnace kept at 200° C. and exposed to flowing air saturated with HCI vapors at 45° C. for about 20 hours. No corrosion of these circuits was found.

Figure 3:
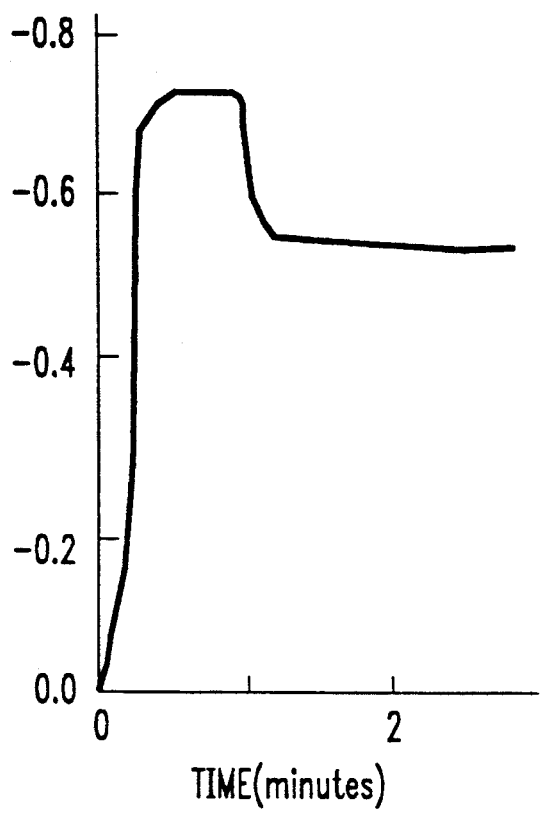
FIG. 3 is a plot of a potential-time curve for Ti metallization in boiling (106° C.) 10 weight percent HCl.
Figure 4:
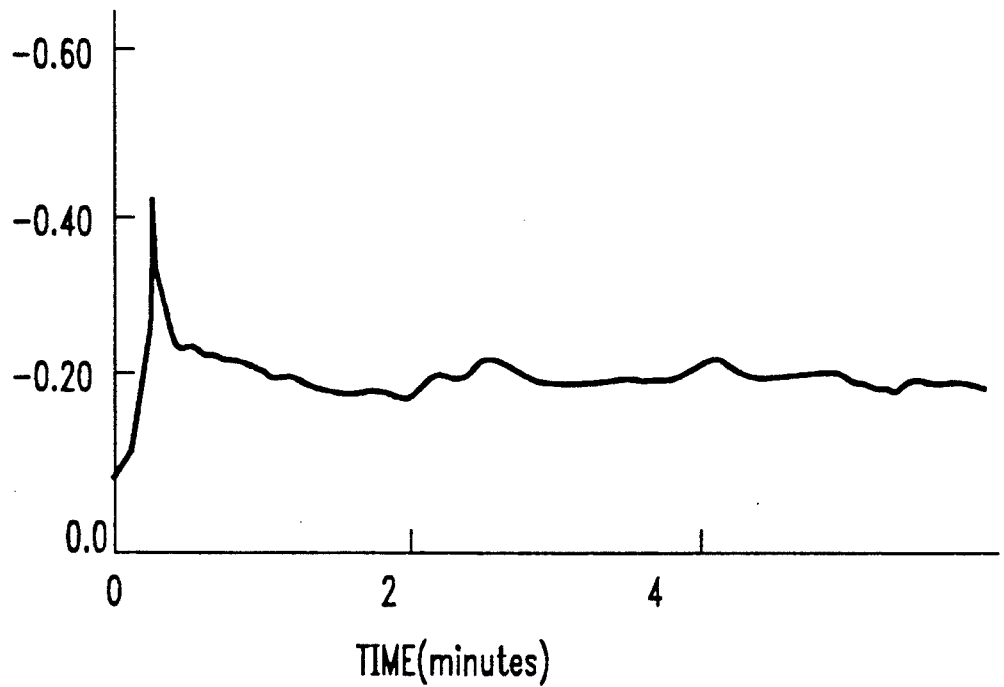
FIG. 4 is a plot of a potential-time curve for Ti/TiPd (3 weight percent Pd) alloy metallization in boiling (106° C.) 10 weight percent HCI.

In FIGS. 3 and 4 are shown potential-time curves for Ti and for the TiTiPd alloy (3 weight percent Pd) metallization, respectively, in boiling (106° C.) 10 percent HCI. Active potential region for Ti and its alloys falls into a range of from −0.8 V to −0.4 V versus saturated calomel electrode (SCE). Ti and its alloys passivate at a potential of −0.4 V (SCE) and above. The corrosion potential, E co,, for Ti, about −0.74 V (SCE), is in the active potential region, and the metal dissolves in about 50 seconds (FIG. 3). The change in potential after about 50 seconds results from the complete dissolution of Ti. The corrosion potential for the alloy metallization is about −0.20 V versus SCE, which is in the passive potential region, and the TiPd metallization is still present after more than 5 minutes. The initial potential spike for the TiPd alloy metallization (FIG. 4) results from the dissolution of the alloy's native oxide.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A circuit including thin film elements and electrical interconnections on a major surface of an insulating substrate, said interconnections comprising:
   a first metal layer comprising titanium formed on said substrate;
   a second metal layer comprising an alloy of titanium and palladium formed on said first metal layer, said alloy comprising 0.3 to 14 weight percent palladium based on the weight of the alloy;
   a third metal layer comprising copper formed on said second metal layer,
   a fourth metal layer comprising nickel formed on said third metal layer;
   a fifth metal layer comprising gold formed on at least portions of said fourth metal layer.

2. The circuit according to claim 1 wherein said first metal layer has a thickness within the range 100 to 300 nm, said second metal layer has a thickness within the range 50 to 300 nm, said third metal layer has a thickness within the range 2,500–4,000 nm, said fourth metal layer has a thickness within the range 800–2,000 nm, and said fifth metal layer has a thickness within the range 700–2,500 nm.

3. The circuit according to claim 1 wherein the fifth metal layer is tonned on substantially the entire surface of said fourth metal layer.

4. The circuit according to claim 1 wherein the fifth metal layer is formed only on the portions of said fourth metal layer which comprise bonding pads for said circuit.

5. A circuit including thin film elements and electrical interconnections on a major surface of an insulating substrate, said interconnections comprising:
   a first metal layer comprising titanium with a thickness in the range 100–300 nm formed on said substrate;
   a second metal layer comprising an alloy of titanium and palladium with thickness in the range 50–300 nm formed on said first metal layer, said alloy comprising palladium in an amount of from 0.3 to 14 weight percent of the alloy;
   a third metal layer comprising copper with a thickness in the range 2,500–4,000 nm formed over said second metal layer;
   a fourth metal layer comprising nickel with a thickness in the range 800–2,000 nm formed on said second layer; and
   a fifth metal layer comprising gold with a thickness in the range 700–2,500 nm formed on at least portions of said fourth metal layer.

6. The circuit according to claim 5 wherein the fifth layer is formed on substantially the entire surface of said fourth layer.

7. The circuit according to claim 1 wherein the fifth layer is formed only on those portions of said fourth layer which comprise bonding pads for said circuit.

* * * * *

UNITED STATES PATENT AND TRADEMARK OFFICE
CERTIFICATE OF CORRECTION

PATENT NO. : 5,288,951            Page 1 of 3

DATED : February 22, 1994

INVENTOR(S) : Robert P. Frankenthal, Ajibola O. Ibidunni, Dennis L. Krause

It is certified that error appears in the above-indentified patent and that said Letters Patent is hereby corrected as shown below:

In the Abstract,

| | |
|---|---|
| Line 1, | "metanization" should read --metallization--. |
| Line 7, | "BF" should read --HF--. |
| Line 9, | "BF" should read --HF--. |
| Line 12, | "metanization" should re --metallization--. |
| | |
| Column 1, Line 6-7, | "metahizations" should read --metallizations--. |
| Column 1, Line 16, | "metanization" should read --metallization--. |
| Column 1, Line 17, | "metahization" should read --metallization--. |
| Column 1, Line 18-19, | "metahization" should read --metallization--. |
| Column 1, Line 34, | "metahization" should read --metallization--. |
| Column 1, Line 35, | "metahizations" should read --metallizations--. |
| Column 1, Line 47, | "metahization" should read --metallization--. |
| Column 1, Line 49, | "metahization" should read --metallization--. |
| Column 1, Line 64, | "BF" should read --HF--. |
| Column 2, Line 6, | "fihn" should read --film--. |
| Column 2, Line 16, | "HCI" should --HCl--. |
| Column 2, Line 19, | "HCI" should read --HCl--. |
| Column 2, Line 26, | "tonned" should read --formed--. |
| Column 2, Line 46, | "BF" should read --HF--. |
| Column 2, Line 52, | "BF" should read --HF--. |
| Column 2, Line 55, | "BF" should read --HF--. |

UNITED STATES PATENT AND TRADEMARK OFFICE
CERTIFICATE OF CORRECTION

PATENT NO. : 5,288,951
DATED : February 22, 1994
INVENTOR(S) : ROBERT P. Frankenthal, Ajibola O. Ibidunni, Dennis L. Krause It is certified that error appears in the above-indentified patent and that said Letters Patent is hereby corrected as shown below:

| | |
|---|---|
| Column 2, Line 57, | "BF" should read --HF--. |
| Column 2, Line 61, | "I1" should read --11--. |
| Column 2, Line 64, | "6" should read --16--. |
| Column 3, Line 65, | "BF" should read --HF--. |
| Column 4, Line 6, | "BF" should read --HF--. |
| Column 4, Line 11, | "BF" should read --HF--. |
| Column 4, Line 36, | "HCI" should read --HCl"--. |
| Column 4, Line 37, | "HCI" first occurrence should read --HCl--. |

UNITED STATES PATENT AND TRADEMARK OFFICE
CERTIFICATE OF CORRECTION

PATENT NO. : 5,288,951
DATED : February 22, 1994
INVENTOR(S) : Robert P. Frankenthal, Ajibola O. Ibidunni, Dennis L. Krause It is certified that error appears in the above-indentified patent and that said Letters Patent is hereby corrected as shown below:

| | |
|---|---|
| Column 4, Line 37, | "HCI" second occurrence should read --HCl--. |
| Column 4, Line 37, | "NAOCI" should read --NaOCl--. |
| Column 4, Line 43, | "HCI" should read --HCl--. |
| Column 4, Line 49, | "HCI" should read --HCl--. |

In the Claims,

Column 5, Line 30,     "tonned" should read --formed--.

Signed and Sealed this

Tenth Day of January, 1995

BRUCE LEHMAN

*Attest:*

*Attesting Officer*     *Commissioner of Patents and Trademarks*